United States Patent
Lee et al.

(10) Patent No.: US 10,396,282 B2
(45) Date of Patent: Aug. 27, 2019

(54) MASK FRAME ASSEMBLY FOR THIN LAYER DEPOSITION, METHOD OF MANUFACTURING THE SAME, AND METHOD OF MANUFACTURING DISPLAY APPARATUS BY USING THE MASK FRAME ASSEMBLY

(71) Applicant: Samsung Display Co., Ltd., Yongin-si (KR)

(72) Inventors: Sangshin Lee, Yongin-si (KR); Kookchol Park, Yongin-si (KR)

(73) Assignee: Samsung Display Co., Ltd, Yongin-si (KR)

( * ) Notice: Subject to any disclaimer, the term of this patent is extended or adjusted under 35 U.S.C. 154(b) by 0 days.

(21) Appl. No.: 15/668,071

(22) Filed: Aug. 3, 2017

(65) Prior Publication Data

US 2017/0358746 A1    Dec. 14, 2017

Related U.S. Application Data

(62) Division of application No. 14/978,471, filed on Dec. 22, 2015, now abandoned.

(30) Foreign Application Priority Data

Apr. 28, 2015    (KR) .................. 10-2015-0059774

(51) Int. Cl.
   *H01L 51/00*    (2006.01)
   *H01L 51/56*    (2006.01)
   *C23C 16/04*    (2006.01)

(52) U.S. Cl.
   CPC ........ *H01L 51/0011* (2013.01); *C23C 16/042* (2013.01); *H01L 51/56* (2013.01)

(58) Field of Classification Search
   CPC .................. H01L 51/0011; C23C 16/042
   See application file for complete search history.

(56) References Cited

U.S. PATENT DOCUMENTS

| 2002/0079339 A1 | 6/2002 | Kokubu |
| 2003/0101932 A1 | 6/2003 | Kang |

(Continued)

FOREIGN PATENT DOCUMENTS

| KR | 10-2003-0046090 | 6/2003 |
| KR | 10-2011-0082416 | 7/2011 |

(Continued)

OTHER PUBLICATIONS

Non-Final Office Action dated Dec. 15, 2016, in U.S. Appl. No. 14/978,471.
Final Office dated Dec. 15, 2016, in U.S. Appl. No. 14/978,471.

*Primary Examiner* — Jay C Chang
*Assistant Examiner* — Mikka Liu
(74) *Attorney, Agent, or Firm* — H.C. Park & Associates, PLC

(57) ABSTRACT

A mask frame assembly through which a deposition material to be deposited on a substrate passes, the mask frame assembly includes a frame including an opening, and a mask having first and second ends in a length direction thereof coupled to the frame, in which the mask includes a main body part having a first thickness and including a pattern part, the pattern part including pattern holes through which the deposition material passes and a support part having a second thickness greater than the first thickness and extending away from first and second ends of the main body part.

13 Claims, 7 Drawing Sheets

(56) References Cited

U.S. PATENT DOCUMENTS

| | | |
|---|---|---|
| 2006/0103289 A1 | 5/2006 | Kim et al. |
| 2011/0168087 A1 | 7/2011 | Lee et al. |
| 2011/0229633 A1* | 9/2011 | Hong .................. H01L 51/0011 427/162 |
| 2012/0266813 A1 | 10/2012 | Hong |
| 2014/0150721 A1 | 6/2014 | Oh et al. |
| 2014/0239049 A1 | 8/2014 | Kang et al. |
| 2016/0043319 A1* | 2/2016 | White .................... G02B 26/02 359/230 |
| 2016/0115580 A1 | 4/2016 | Mizumura |
| 2016/0281209 A1* | 9/2016 | Mizumura ........... B23K 26/066 |

FOREIGN PATENT DOCUMENTS

| | | |
|---|---|---|
| KR | 10-2011-0104793 | 9/2011 |
| KR | 10-2014-0070255 | 6/2014 |
| KR | 10-2014-0107037 | 9/2014 |

\* cited by examiner

MASK FRAME ASSEMBLY FOR THIN LAYER DEPOSITION, METHOD OF MANUFACTURING THE SAME, AND METHOD OF MANUFACTURING DISPLAY APPARATUS BY USING THE MASK FRAME ASSEMBLY

CROSS-REFERENCE TO RELATED APPLICATION

This application is a Divisional of U.S. patent application Ser. No. 14/978,471, filed on Dec. 22, 2015, and claims priority from and the benefit of Korean Patent Application No. 10-2015-0059774, filed on Apr. 28, 2015, which is hereby incorporated by reference for all purposes as if fully set forth herein.

BACKGROUND

Field

Exemplary embodiments relate to a mask frame assembly, a method of manufacturing the same, and a method of manufacturing a display apparatus using the mask frame assembly.

Discussion of the Background

In flat panel display apparatuses, an organic light-emitting display apparatus may generally be a self-luminous display apparatus. The organic light-emitting display apparatus may be driven at a low voltage and has a wide viewing angle and high contrast. In addition, the organic light-emitting display apparatus may have a fast response time, be lightweight, and have a slim profile. As such, the organic light-emitting display apparatus may be considered as a next-generation display apparatus.

Light-emitting devices may be classified into inorganic light-emitting devices and organic light-emitting devices, according to materials forming an emission layer. The organic light-emitting devices have been actively researched recently, due to their higher luminance and faster response times, as compared to inorganic light-emitting devices, and their capabilities to implement full colors.

Organic layers and/or electrodes of organic light-emitting display apparatuses may be formed by vacuum deposition. However, as a resolution of organic light-emitting display apparatuses increases, a width of an open slit of a mask used in a deposition process and the distribution of the open slit may be decreased. As such, to manufacture a high-resolution organic light-emitting display apparatus, a shadow effect may need to be reduced or prevented from occurring. Accordingly, a deposition process may be performed when a substrate and a mask are closely adhered to each other.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a mask frame assembly, a method of manufacturing the same, and a method of manufacturing a display apparatus using the mask frame assembly.

Additional aspects will be set forth in the detailed description which follows and, in part, will be apparent from the description, or may be learned by practice of the inventive concept.

An exemplary embodiment discloses a mask frame assembly through which a deposition material to be deposited on a substrate passes, the mask frame assembly including a frame including an opening, and a mask having first and second ends in a length direction thereof coupled to the frame, in which the mask includes a main body part having a first thickness and including a pattern part, the pattern part including pattern holes through which the deposition material passes, and a support part having a second thickness greater than the first thickness and extending away from first and second ends of the main body parts.

An exemplary embodiment also discloses a method of manufacturing a mask frame assembly including preparing a main body part having a first thickness and including a pattern part, the pattern part including pattern holes through which a deposition material passes, preparing a support part having a second thickness that is greater than the first thickness, arranging the support part at both ends of the main body part, and coupling the main body part and the support part to each other.

An exemplary embodiment further discloses a method of manufacturing a display apparatus that includes a substrate, a first electrode, a second electrode facing the first electrode, and an organic layer disposed between the first electrode and the second electrode, the method including depositing the organic layer or the second electrode by using a mask frame assembly, in which the mask frame assembly includes a frame and a mask coupled to the frame by coupling first and second ends of the mask in a length direction of the mask to first and second ends of the frame, the frame includes an opening, and the mask includes a main body part having a first thickness and includes a pattern part, the pattern part including pattern holes through which the deposition material passes, and a support part having a second thickness greater than the first thickness and extending away from first and second ends of the main body part.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
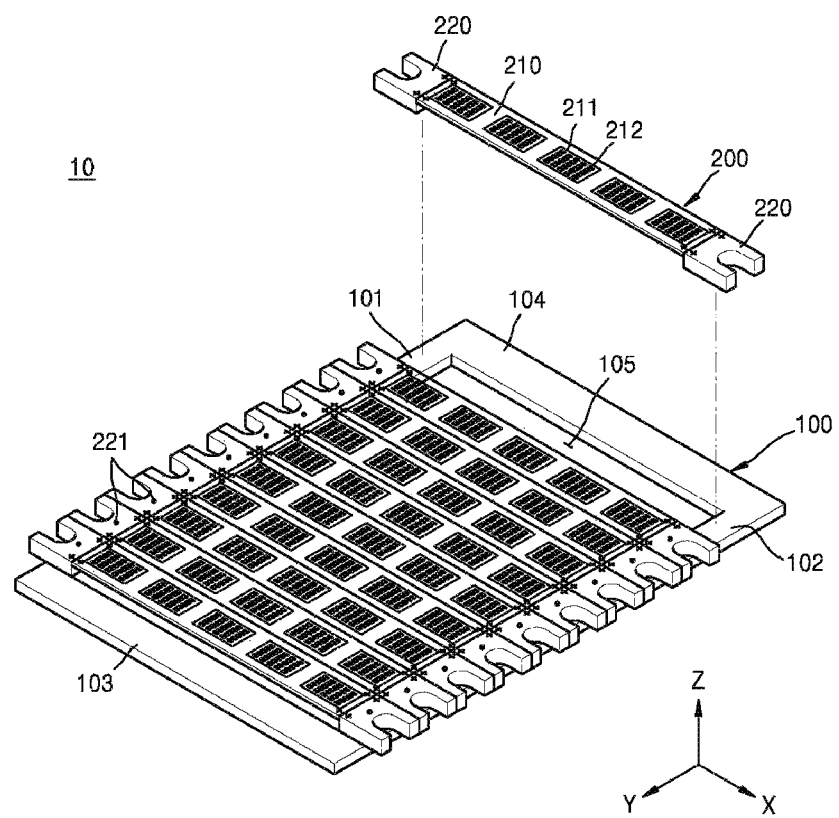
FIG. 1 is a schematic exploded view of a mask frame assembly according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
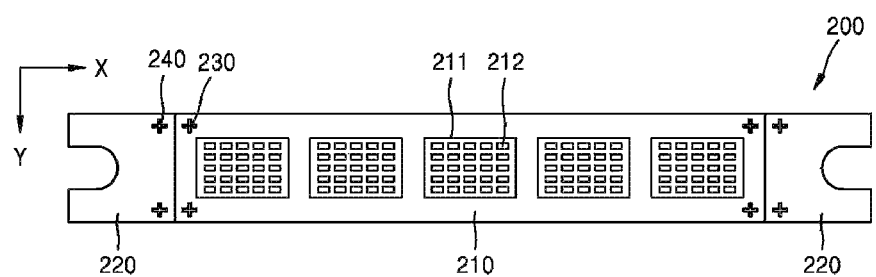
FIG. 2 is a plan view of an upper portion of the mask of FIG. 1.
Figure 3:
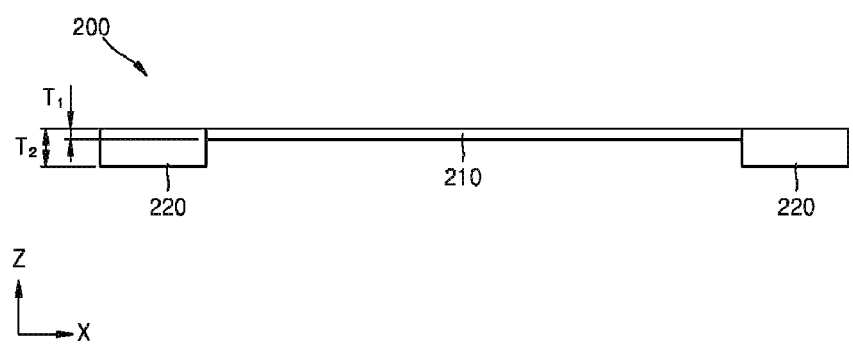
FIG. 3 is a side view of the mask of FIG. 2.

FIG. 1 is a schematic exploded view of a mask frame assembly according to an exemplary embodiment. FIG. 2 is a plan view of an upper portion of the mask of FIG. 1. FIG. 3 is a side view of the mask of FIG. 2.

Referring to FIG. 1, a mask frame assembly 10 may include a frame 100 having an opening 105 and masks 200. Both ends of the masks 200 are coupled to the frame 100 in a length direction of the masks 200 (x-axis direction).

The frame 100 may have a quadrangle shape including the opening 105 in the middle of the frame 100. The frame includes a first support part 101 and a second support part 102 disposed apart from and in parallel to each other in the x-axis direction, and a third support part 103 and a fourth support part 104 disposed apart from and in parallel to each other in a y-axis direction.

The first support part 101 and the second support part 102 may be connected to the third support part 103 and the fourth support part 104, and form an outer frame of the mask frame assembly 10. The opening 105 may be formed in various shapes, such as a circular shape, an oval shape, or a polygonal shape. The frame 100 may be formed of a metal, a synthetic resin, or the like.

The third support part 103 and the fourth support part 104 may be disposed in parallel to the masks 200. Since the masks 200 extend in the length direction of the third support part 103 and the fourth support part 104 (the x-axis direction) and are coupled to the frame 100, the frame 100 may be formed of a material with high rigidity or having elasticity.

The masks 200 may have a stick shape, and each mask 200 may include a main body part 210 and a support part 220. The main body part 210 may have a first thickness T1 of about 5 μm to about 20 μm (see FIG. 3) and include pattern parts 211 disposed apart from each other in the length direction of the masks 200, i.e., the x-axis direction. Each of the pattern parts 211 may include pattern holes 212. During a deposition process, a deposition material passing through the pattern holes 212 may be deposited on a substrate (not shown), so as to define a deposition region on the substrate.

The masks 200 may be magnetic thin films and include nickel or nickel alloy. For example, the masks 200 may be formed of nickel-cobalt alloy, which may be easy to form a micro-pattern therein and have excellent surface roughness.

The masks 200 may be formed by etching. More particularly, a photoresist layer may be formed on a thin film by using a photoresist to have the same pattern as the pattern holes 212, or a film having the same pattern as the pattern holes 212 may be attached to a thin film, and then the thin film may be etched. The masks 200 may also be manufactured by eletro-forming or electroless plating.

In FIGS. 1 and 2, the main body part 210 includes five pattern parts 211 spaced apart from each other and twenty-five pattern holes formed in each of the pattern parts 211. It is noted that the number and arrangement of the pattern parts 211, and the number of the pattern holes 212, may vary. In addition, the pattern holes 212 are illustrated as a masking pattern having a dot shape, however, the number, a position, and a shape of the pattern holes 212 may vary without departing from the inventive concept. For example, the pattern parts 211 may be a masking pattern that are entirely opened, having a stripe shape, etc. Hereinafter, the main body part 210 of the mask 200 will be illustrated as including five pattern parts 211 with twenty-five pattern holes 212 formed in each pattern parts 211.

According to an exemplary embodiment, the masks 200 may be formed as a single large member to cover the entire opening 105 of the frame 100. Hereinafter, the masks 200 having a stick shape, as illustrated in FIG. 1, will be described in detail.

The support part 220 may extend outwardly from both ends of the main body part 210 in the x-axis direction. The support part 220 may have a second thickness T2 of about 25 μm to 100 μm, which may be greater than the first thickness T1 of the main body part 210 (see FIG. 3). The support part 220 may include a welding part 221 through which the masks 200 may be coupled to the frame 100. Each of the masks 200 may include a pair of welding parts, as illustrated in FIG. 1, or multiple welding parts to increase coupling stability between the masks 200 and the frame 100.

Each of the masks 200 is coupled to the frame 100 via the support part 220. Referring to FIGS. 1 to 3, an upper surface of each masks 200 may be formed to be parallel to a substrate, on which a deposition material is deposited during a deposition process.

The masks 200 may be manufactured by using a photolithography process. A photoresist that has a pattern corresponding to the pattern holes 212 is coated on a base material of the masks 200, and exposing and developing processes are performed thereon, to form the pattern holes 212 through which a deposition material may pass.

For a display apparatus with high resolution, a size of each pattern holes 212 may be formed small in size. As such, the first thickness T1 of the main body part 210 of each masks 200, where the pattern holes 212 are formed, may be formed small, so that the pattern holes 212 may be shaped precisely. When the thickness of the main body part 210 is less than 20 μm, the masks 200 may be transformed or damaged while the masks are extended and then welded to the frame 100, which may degrade the quality of welding.

According to an exemplary embodiment, the mask frame assembly 10 may include the mask 200, which includes the support part 220 having a second thickness T2 that is greater than the first thickness T1 of the main body part 210. The support part 220 of the mask 200 may be a portion of the mask 200 that is directly coupled to the frame 100 by welding. As such, in order to display in high resolution, the first thickness T1 of the main body part 210, where the pattern holes 212 are formed, may be formed small, and the second thickness T2 of the support part 220, through which the mask 200 is coupled to the frame 100, may be formed greater than the first thickness T1 of the main body part 210. Accordingly, the quality of welding the mask 200 to the frame 100 may be improved.

According to an exemplary embodiment, the main body part 210 and the support part 220 of the mask 200 may be independently formed of different materials and then coupled to each other, by irradiating a laser on a surface where the main body part 210 and the support part 220 contact each other.

At least one first alignment key 230 may be formed in corners of the main body part 210, and at least one second alignment key 240 may be formed in corners of the support part 220, to easily align the main body part 210 with the support part 220 in the x axis direction. The first alignment key 230 and the second alignment key 240 may be aligned in the length direction of the mask 200, i.e., the x-axis direction, to correspond to each other, and the main body part 210 and the support part 220 may be precisely aligned to each other by monitoring positions of the first alignment key 230 and the second alignment key 240.

Although, in FIGS. 1 and 2, the first alignment key 230 and the second alignment key 240 are illustrated to be formed on the upper surface of the mask 200 facing the substrate during a deposition process, the first alignment key 230 and the second alignment key 240 may be formed on a surface of the mask 200 contacting the frame 100, which is an opposite surface to the upper surface of the mask 200. Alternatively, the first and second alignment keys 230 and 240 may be formed to pass through the support part 220. As such, shapes and positions of the first alignment key 230 and the second alignment key 240 may be formed in various shapes and at any positions, to easily align the main body part 210 with the support part 220 during a coupling process.

Figure 4:
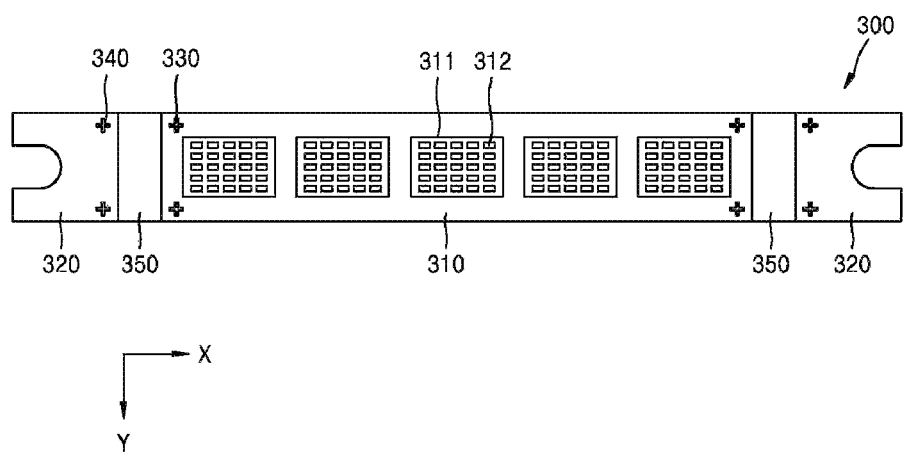
FIG. 4 is a plan view of a mask according an exemplary embodiment.
Figure 5:
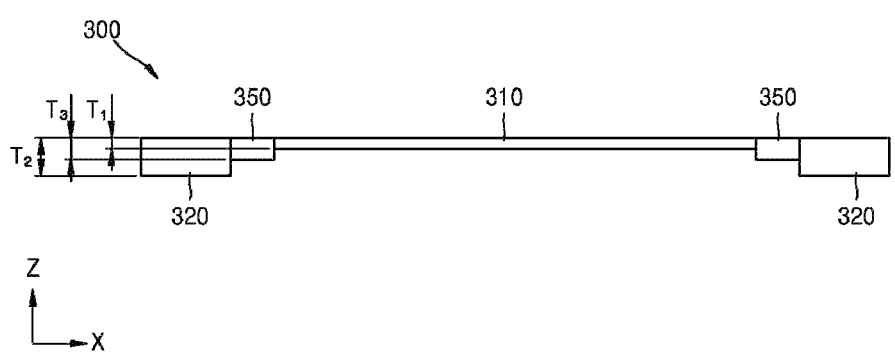
FIG. 5 is a side view of the mask of FIG. 4.

FIG. 4 is a plan view of a mask according an exemplary embodiment. FIG. 5 is a side view of the mask of FIG. 4.

The mask 300 according to an exemplary embodiment may include a main body part 310, a support part 320, a first alignment key 330, a second alignment key 340, a step part 350, pattern parts 311, and pattern holes 312. Operations and components of the mask 300 may be substantially the same as those of the mask 200 described with reference to FIGS. 1 to 3, and thus, duplicated description thereof will be omitted.

Referring to FIGS. 4 and 5, the step part 350 may have a third thickness T3, which is greater than a first thickness T1 of the main body part 310 and less than a second thickness T2 of the support part 320. The step part 350 may be formed between the main body part 310 and the support part 320. The step part 350 may reduce the difference between the thicknesses of the main body part 310 and the support part 320.

The support part 320 may have the second thickness T2, which is about 1.25 times to about 20 times greater than the first thickness T1 of the main body part 310. When the second thickness T2 of the support part 320 is formed to be about 20 times greater than the first thickness T1 of the main body part 310, the step part 350 having the third thickness T3, which may be greater than the first thickness T1 and less than the second thickness T2, may be disposed between the main body part 310 and the support part 320, to prevent rigidity degradation of the mask 300 from a large thickness difference between the main body part 310 and the support part 320.

Figure 6:
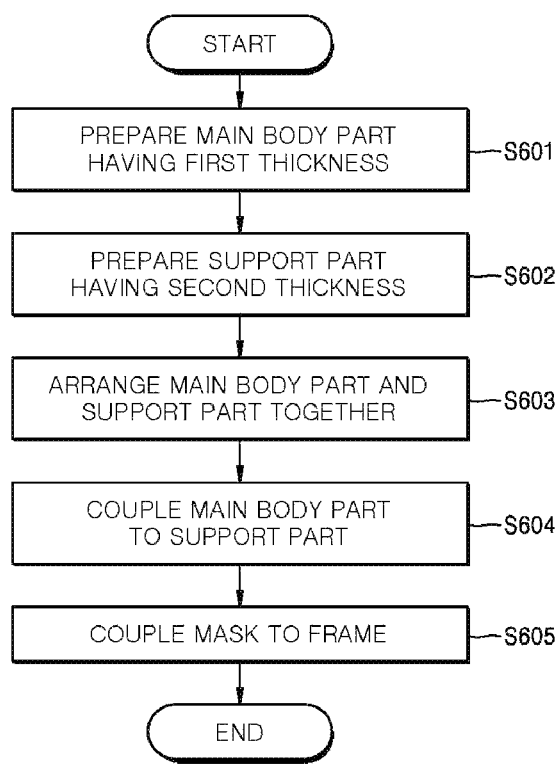
FIG. 6 is a flowchart illustrating a method of manufacturing the mask frame assembly of FIG. 1.

FIG. 6 is a flowchart illustrating a method of manufacturing the mask frame assembly 10 of FIG. 1. Referring to FIG. 6, the mask frame assembly 10 according to an exemplary embodiment may be manufactured as described below.

First, the main body part 210 having the first thickness T1 and including the pattern parts 211, which include the pattern holes 212 through which a deposition material passes, is prepared. (S601). Next, the support part 220 having the second thickness T2 that is greater than the first thickness T1 of the main body part 210 is prepared (S602). The main body part 210 and the support part 220 may be formed to have substantially the same width. Then, the support parts 220 are respectively arranged at both ends of the main body part 210 (S603). Next, a laser is irradiated to a surface where the main body part 210 and the support part 220 contact each other, to weld the support part 220 to the main body part 210 (S604). As a result, the mask 200 is manufactured, and both ends of the mask 200 are coupled to the frame 100 to manufacture the mask frame assembly 10 (S605).

At least one first alignment key 230 may be formed at corners of the main body part 210, and at least one second alignment key 240 may be formed at corners of the support part 220. The first alignment key 230 and the second alignment key 240 may be aligned with each other in the length direction of the mask 200 to correspond to each other, during arranging the support parts at both ends of the main body part 210 (S603), such that the main body part 210 and the support part 220 may be welded precisely to each other, during welding the support part 220 to the main body part 210 (S604).

The support part 220 may have a width greater than a width of the main body part 210. In this case, portions of the support part 220 may be cut off in a cutting process, after the main body part 210 and the support part 220 are arranged on the frame 100 (S603), so that the width of the main body part 210 substantially corresponds to the width of the support part 220. The cutting process of the support part 220 may include a water jet method, in which a high-pressure water jet is sprayed to the support part 220, or a general laser cutting method, in which a laser is irradiated to a surface of the support part 220 that is to be cut.

Figure 7:
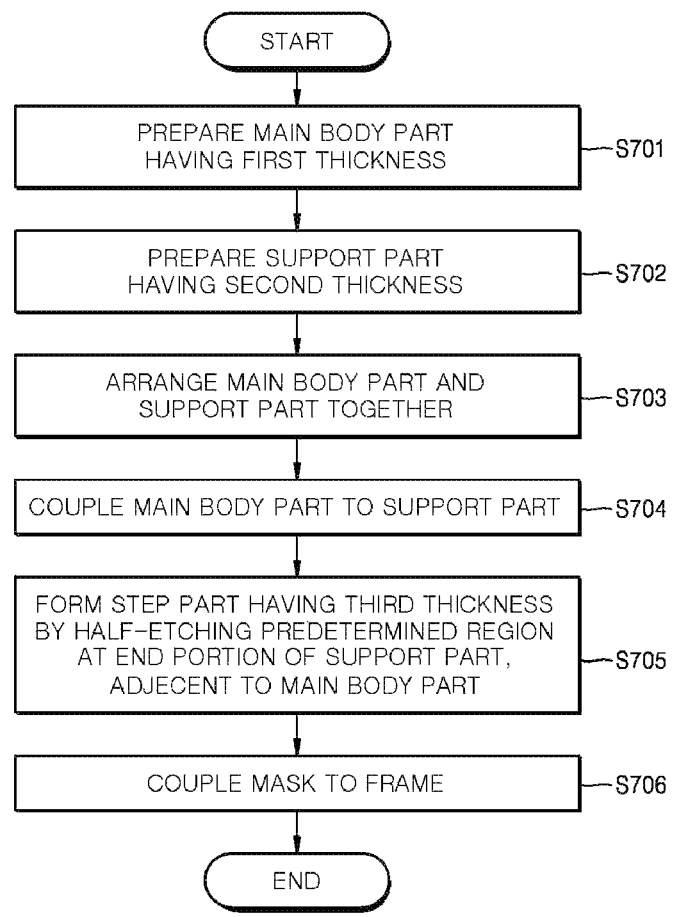
FIG. 7 is a flowchart illustrating a method of manufacturing a mask frame assembly of FIG. 4.
Figure 8:
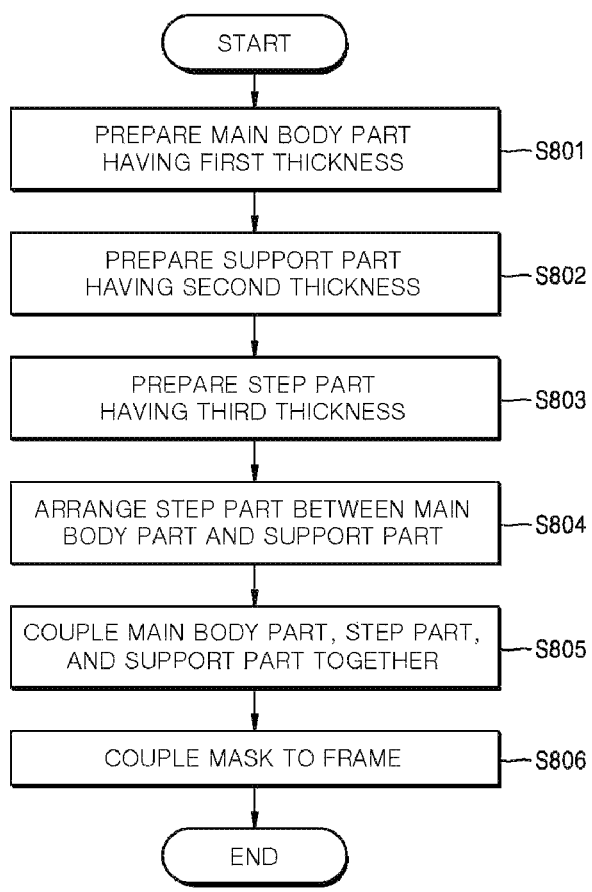
FIG. 8 is a flowchart illustrating a method of manufacturing the mask frame assembly of FIG. 7.

FIG. 7 is a flowchart illustrating a method of manufacturing the mask frame assembly of FIG. 4. FIG. 8 is a flowchart illustrating a method of manufacturing the mask frame assembly of FIG. 7. Referring to FIG. 7, the mask 300 illustrated with reference to FIG. 4 may be manufactured as described below.

The method of manufacturing the mask 300, including preparing the main body part 310 having a first thickness T1 (S701), preparing the support part 320 having a second thickness T2 (S702), arranging the main body part 310 and the support part 320 (S703) together, coupling the main body part 310 and the support part 320 (S704) together, and coupling the mask 300 and the frame 100 (S706) together, are substantially the same as the method of manufacturing the mask frame assembly 10 illustrated with reference to FIG. 6, and thus, duplicative descriptions thereof will not be omitted.

The mask 300 of FIG. 4 further includes the step part 350, in comparison to the mask 200 of FIGS. 1 to 3. After the coupling of the main body part 310 and the support part 320 together (S704), the step part 350 may be formed by half-etching predetermined regions of both ends of the support part 320 adjacent to the main body part 310, such that the third thickness T3 of the step part may be greater than the first thickness T1 of the main body part 310 and less than the second thickness T2 of the support part 320 (S705).

Referring to FIG. 8, the step part 350 may be formed as a separate member independently from the main body part 310 and the support part 320, instead of half-etching the predetermined regions of both ends of the support part 320.

More particularly, the main body part 310 having the first thickness T1 and the support part 320 having the second thickness T2 are prepared (S801 and S802). The step part 350 having the third thickness T3 that is greater than the first thickness T1 and less than the second thickness T2 is prepared (S803). Then, when the support parts 320 are arranged respectively at both ends of the main body part 310, the step part 350 is arranged therebetween (S804). The main body part 310, the step part 350, and the support part 320 are sequentially coupled to each other to manufacture the mask 300 (S805). Here, a laser may be irradiated to a surface where the main body part 310 and the step part 350 contact each other, and a surface where the step part 350 and the support part 320 contact each other, to be coupled with each other.

At least one third alignment key (not illustrated) may be formed in corners of the step part 350, in addition to the first alignment key 330 of the main body part 310 and the second alignment key 340 of the support part 320, such that the step part 350, the main body part 310, and the support part 320 may be easily aligned in the x axis direction. The first alignment key 330, the second alignment key 340, and the third alignment key (not illustrated) may be aligned in the length direction of the mask 300, to correspond to each other, and the main body part 310, the support part 320, and the step part 350 may be precisely aligned to each other by monitoring positions of the first alignment key 330, the second alignment key 340, and the third alignment key (not illustrated).

Figure 9:
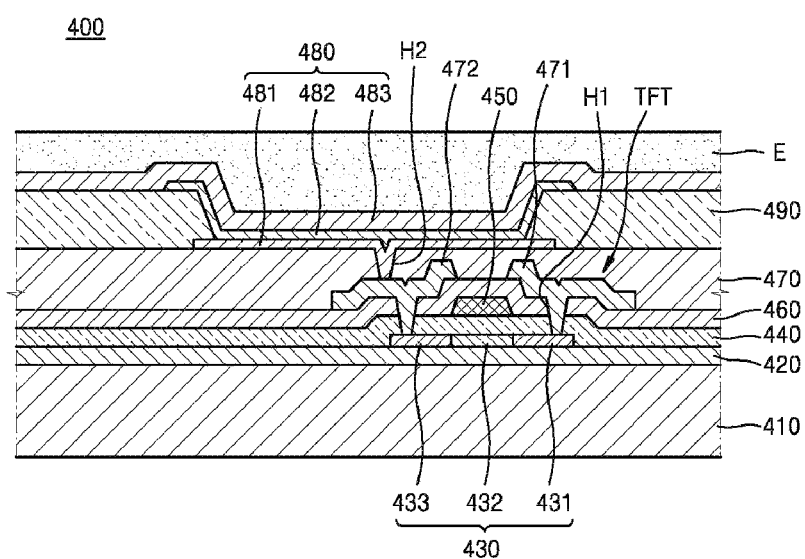
FIG. 9 is a view of a display apparatus manufactured by using the mask frame assembly illustrated in FIG. 1 or FIG. 4.

FIG. 9 illustrates a view of a display apparatus manufactured by using the mask frame assembly illustrated in FIG. 1 or FIG. 4.

Referring to FIG. 9, a display apparatus 400 may include a substrate 410 and a display portion (not shown). The display apparatus 400 may include a thin-film encapsulation layer E or an encapsulation substrate (not shown) disposed on an upper portion of the display portion. The encapsulation substrate may be generally used in a display apparatus, and thus, detailed descriptions thereof will be omitted. Hereinafter, the display apparatus 400 including the thin-film encapsulation layer E will be described in detail.

The display portion may be formed on the substrate 410. The display portion may include a thin-film transistor TFT, a passivation layer 470 formed to cover the thin-film transistor TFT, and an organic light-emitting device 480 disposed on the passivation layer 470.

The substrate 410 may be formed of a glass material. Alternatively, the substrate 410 may include a plastic material, a metallic material, such as stainless steel (SUS) or titanium (Ti), or polyimide (PI). Hereinafter, the substrate 410 formed of a glass material will be described in detail.

A buffer layer 420 formed of an organic compound and/or an inorganic compound may be further formed on the substrate 410. The buffer layer 420 may be formed of silicon oxide ($SiO_X$) (wherein, $X \geq 1$) or silicon nitride ($SiN_X$) (wherein, $X \geq 1$).

An active layer 430 arranged in a predetermined pattern may be formed on the buffer layer 420, and a gate insulating layer 440 may be disposed on the active layer 430. The active layer 430 may include a source region 431, a drain region 433, and a channel region 432 between the source region 431 and the drain region 433.

The active layer 430 may include various materials. The active layer 430 may include an inorganic semiconductor material such as amorphous silicon or crystalline silicon. Alternatively, the active layer 430 may include an oxide semiconductor or an organic semiconductor material. Hereinafter, the active layer 430 including amorphous silicon will be described in detail.

An amorphous silicon layer may be formed on the buffer layer 420, and the amorphous silicon layer may be crystallized to form a polycrystalline silicon layer. The polycrystalline silicon layer may then be patterned to form the active layer 430. The source region 431 and the drain region 433 of the active layer 430 may be doped with impurities depending on a type of a thin-film transistor TFT, for example, a driving thin-film transistor (not shown), a switching thin-film transistor (not shown), or the like.

A gate electrode 450 corresponding to the active layer 430 and an interlayer insulating layer 460 burying the gate electrode 450 may be formed on an upper surface of the gate insulating layer 440.

Contact holes H1 may be formed in the interlayer insulating layer 460 and the gate insulating layer 440. A source electrode 471 and a drain electrode 472 may be formed on the interlayer insulating layer 460, so that the source electrode 471 and the drain electrode 472 respectively contact the source region 431 and the drain region 433 of the active layer 430 through the contact holes H1.

The thin-film transistor TFT may be formed in the above process, and the passivation layer 470 may be formed on the thin film transistor TFT. A pixel electrode 481 of the organic light-emitting device 480 may be formed on the passivation layer 470. The pixel electrode 481 may contact the drain electrode 472 of the thin-film transistor TFT through a via hole H2 formed in the passivation layer 470. The passivation layer 470 may include an inorganic material and/or an organic material and formed as a monolayer or multiple layers. The passivation layer 470 may be formed as a planarization layer to make an upper surface thereof even, regardless of unevenness of a lower layer, or be formed to have an uneven upper surface along with the unevenness of the lower layer. The passivation layer 470 may be formed as a transparent insulating layer to exhibit a resonance effect.

After forming the pixel electrode 481 on the passivation layer 470, a pixel-defining layer 490 including an organic material and/or an inorganic material may be formed, so as to cover the pixel electrode 481 and the passivation layer 470. A portion of the pixel electrode 481 may be exposed through the pixel-defining layer 490. An intermediate layer 482 and an opposite electrode 483 may be formed on at least part of the pixel electrode 481.

The pixel electrode 481 may serve as an anode electrode and the opposite electrode 483 may serve as a cathode electrode, or vice versa. The pixel electrode 481 and the opposite electrode 483 may be insulated from each other by the intermediate layer 482. Voltages with different polarities may be applied to the intermediate layer 482, such that an organic emission layer emit light.

The intermediate layer 482 may include the organic emission layer. Alternatively, the intermediate layer 482 may include the organic emission layer and may further include at least one selected from a hole injection layer (HIL), a hole transport layer (HTL), an electron transport layer (ETL), and an electron injection layer (EIL).

According to an exemplary embodiment, one unit pixel may include sub-pixels R, G, and B, in which the sub-pixels R, G, and B may emit lights of various colors. Alternatively, one unit pixel may include sub-pixels emitting red, green, blue, and white light.

The thin-film encapsulation layer E may include inorganic layers, or include an inorganic layer and an organic layer. The organic layer of the thin-film encapsulation layer E may include a polymer, and may be formed as a monolayer or a stack form, including at least of polyethylene terephthalate, polyimide, polycarbonate, epoxy, polyethylene and polyacrylate. Furthermore, the organic layer may be formed of polyacrylate, and in detail, may include a polymer of a monomer composition including a diacrylate-group monomer and a triacrylate-group monomer. A monoacrylate-group monomer may be further included in the monomer composition. In addition, a photo-initiator, such as thermoplastic polyolefin (TPO), may be further included in the monomer composition.

The inorganic layer of the thin-film encapsulation layer E may be a monolayer or a stack layer including a metal oxide or a metal nitride. The inorganic layer may include at least one of silicon nitride ($SiN_x$), aluminum oxide ($Al_2O_3$), silicon oxide ($SiO_2$), and titanium oxide ($TiO_2$). The uppermost layer of the thin-film encapsulation layer E, which is exposed to the outside, may be formed of an inorganic layer to prevent infiltration of humidity toward the organic light-emitting device OLED.

The thin-film encapsulation layer E may include at least one sandwich structure, in which at least one organic layer is disposed between at least two inorganic layers, or at least one inorganic layer is disposed between at least two organic layers. Alternatively, the thin-film encapsulation layer E may include a sandwich structure, in which at least one organic layer is disposed between at least two inorganic layers, and a sandwich structure, in which at least one inorganic layer is inserted between at least two organic layers. The thin-film encapsulation layer E may include a first inorganic layer, a first organic layer, a second inorganic layer, a second organic layer, and a third inorganic layer, sequentially disposed on an upper surface of the organic light-emitting device OLED. Alternatively, the thin-film encapsulation layer E may include a first inorganic layer, a first organic layer, a second inorganic layer, a second organic layer, a third inorganic layer, a third organic layer, and a fourth inorganic layer, sequentially disposed on the upper surface of the organic light-emitting device OLED.

A halogenated metal layer including lithium fluoride (LiF) may be additionally included between the organic light-emitting device OLED and the first inorganic layer. The halogenated metal layer may prevent the organic light-emitting device OLED from being damaged, when the first inorganic layer is formed by using a sputtering method.

The first organic layer may be formed to have a smaller area than the second inorganic layer, and the second inorganic layer may also be formed to have a smaller area than the third inorganic layer.

Thus, in an exemplary embodiment of the present inventive concept, a portion of a mask through which a deposition material passes, is formed to have a small thickness, and other portions of the mask that are coupled to a frame is formed to have a larger thickness, such that welding the mask to the frame may be performed stably, so that a display apparatus with high resolution may be manufactured.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A mask frame assembly through which a deposition material to be deposited on a substrate passes, the mask frame assembly comprising:
   a frame comprising an opening; and
   a mask coupled to the frame,
   wherein:
   the mask comprises:
   a main body part having a first thickness and comprising a pattern part and at least one first alignment key, the pattern part comprising pattern holes through which the deposition material passes; and a support part having a second thickness greater than the first thickness and contacting the frame and comprising at least one second alignment key;

a lower surface of the main body part is higher than a plane connecting two opposing lower surfaces of the support part contacting the frame;

an upper surface of the main body part and an upper surface of the support part are arranged in the same plane; and the at least one first alignment key and the at least one second alignment key are aligned to correspond to each other in a length direction of the mask.

2. The mask frame assembly of claim 1, further comprising a step part disposed between the main body part and the support part.

3. The mask frame assembly of claim 2, wherein the step part has a third thickness that is greater than the first thickness and less than the second thickness.

4. The mask frame assembly of claim 1, wherein the first thickness is in a range of about 5 μm to about 20 μm.

5. The mask frame assembly of claim 1, wherein the second thickness is in a range of about 25 μm to about 100 μm.

6. The mask frame assembly of claim 1, wherein a surface of the mask facing the substrate is planar.

7. A mask frame assembly through which a deposition material to be deposited on a substrate passes, the mask frame assembly comprising:

a frame comprising an opening; and a mask coupled to the frame, the mask comprising:

a main body part having a first thickness and comprising a pattern part, the pattern part comprising pattern holes through which the deposition material passes; and a support part having a second thickness greater than the first thickness and contacting the frame;

wherein:

a lower surface of the main body part is higher than a plane connecting two opposing lower surfaces of the support part contacting the frame;

an upper surface of the main body part and an upper surface of the support part are arranged in the same plane; and the support part and the main body part are separated from each other and welded to each other.

8. The mask frame assembly of claim 7, wherein:

at least one first alignment key is formed at the main body part;

at least one second alignment key is formed at the support part; and the at least one first alignment key and the at least one second alignment key are aligned to correspond to each other in a length direction of the mask.

9. The mask frame assembly of claim 7, further comprising a step part disposed between the main body part and the support part.

10. The mask frame assembly of claim 9, wherein the step part has a third thickness that is greater than the first thickness and less than the second thickness.

11. The mask frame assembly of claim 7, wherein the first thickness is in a range of about 5 μm to about 20 μm.

12. The mask frame assembly of claim 7, wherein the second thickness is in a range of about 25 μm to about 100 μm.

13. The mask frame assembly of claim 7, wherein a surface of the mask facing the substrate is planar.

* * * * *